(12) United States Patent
Watanabe et al.

(10) Patent No.: US 10,819,335 B2
(45) Date of Patent: Oct. 27, 2020

(54) REFERENCE VOLTAGE CIRCUIT AND POWER-ON RESET CIRCUIT

(71) Applicant: ABLIC Inc., Chiba-shi, Chiba (JP)

(72) Inventors: Kotaro Watanabe, Chiba (JP); Sukhwinder Singh, Nagoya (JP)

(73) Assignee: ABLIC Inc., Chiba (JP)

( * ) Notice: Subject to any disclaimer, the term of this patent is extended or adjusted under 35 U.S.C. 154(b) by 0 days.

(21) Appl. No.: 16/601,156

(22) Filed: Oct. 14, 2019

(65) Prior Publication Data

US 2020/0136606 A1    Apr. 30, 2020

(30) Foreign Application Priority Data

Oct. 24, 2018   (JP) ................. 2018-199727

(51) Int. Cl.
*G05F 3/02*   (2006.01)
*H03K 17/22*  (2006.01)
*G05F 3/24*   (2006.01)

(52) U.S. Cl.
CPC .............. *H03K 17/223* (2013.01); *G05F 3/24* (2013.01)

(58) Field of Classification Search
CPC ........ H03K 17/22; H03K 17/223; G05F 3/24; G05F 3/242; G05F 3/245; G05F 3/247; G05F 3/262; G05F 3/265; G05F 3/30; G05F 3/465; G06F 1/24
See application file for complete search history.

(56) References Cited

U.S. PATENT DOCUMENTS

| | | | | |
|---|---|---|---|---|
| 8,174,309 B2 * | 5/2012 | Yoshino | .................. | G05F 3/242 327/541 |
| 2008/0297132 A1 * | 12/2008 | Aota | .................... | H02M 3/1588 323/313 |
| 2013/0194011 A1 * | 8/2013 | Oka | ...................... | H03K 17/223 327/143 |

FOREIGN PATENT DOCUMENTS

JP        2013-179561 A        9/2013

* cited by examiner

*Primary Examiner* — Long Nguyen
(74) *Attorney, Agent, or Firm* — Brinks Gilson & Lione

(57) ABSTRACT

A reference voltage circuit includes a first output terminal from which a first reference voltage is supplied; a first MOS transistor of a depletion type, the first MOS transistor containing a drain connected to a power supply terminal, a gate connected to a ground terminal, and a source; a first voltage drop circuit including a first end connected to the source of the first MOS transistor and a second end connected to the first output terminal; and a second MOS transistor of a depletion type, the second MOS transistor containing a drain connected to the first output terminal, a gate connected to the ground terminal, and a source connected to the ground terminal.

5 Claims, 3 Drawing Sheets

US 10,819,335 B2

REFERENCE VOLTAGE CIRCUIT AND POWER-ON RESET CIRCUIT

RELATED APPLICATIONS

This application claims priority to Japanese Patent Application No. 2018-199727, filed on Oct. 24, 2018, the entire content of which is incorporated herein by reference.

BACKGROUND OF THE INVENTION

1. Field of the Invention

The present invention relates to a reference voltage circuit and a power-on reset circuit.

2. Description of the Related Art

A reference voltage circuit is used in some semiconductor integrated circuits. The characteristics of a reference voltage circuit in a semiconductor integrated circuit are one of factors that determine the performance of the semiconductor integrated circuit.

FIG. 3 is a diagram for illustrating a configuration of a power-on reset circuit 100 as a prior art. The power-on reset circuit 100 including conventional reference voltage circuit 110 is described in, e.g., Japanese Patent Application Laid-open No. 2013-179561. The power-on reset circuit 100 is composed of the reference voltage circuit 110 for outputting a reference voltage, and a reset signal output circuit 120 for outputting a reset signal based on the reference voltage output by the reference voltage circuit 110. The reference voltage circuit 110 is composed of a depletion N-channel MOS transistor (which will be hereinafter referred to as "DNMOS") 111 and an enhancement N-channel MOS transistor (which will be hereinafter referred to as "ENMOS") 112.

A power supply voltage VDD is applied to a power supply terminal 101, and then rises in a transition state. The reset signal output circuit 120 is configured to output a reset signal if the power supply voltage VDD is lower than a reset cancellation voltage in the transition state. The reset cancellation voltage is a predetermined voltage set in advance.

The reset signal is a signal that causes another circuit (not illustrated) connected to an output terminal 103 to shift into a reset state or the other circuit to shift into a reset canceled state in which the reset state is canceled.

If the power supply voltage of the power supply terminal 101 reaches the given voltage, the reset signal output circuit 120 also outputs the reset signal that causes the other circuit to shift into the reset cancellation state.

For that reason, the reference voltage circuit 110 is required to output a reference voltage in such a manner that prevents the triggering of reset cancellation at a voltage level of the power supply voltage VDD that causes the other circuit to operate abnormally, in the process of the rise of the power supply voltage VDD to the reset cancellation voltage.

In other words, the reference voltage circuit 110 is desired to output a given reference voltage suited to the reset cancellation voltage described above to the reset signal output circuit 120 downstream of the reference voltage circuit 110 when the power supply voltage VDD reaches the reset cancellation voltage.

In the reference voltage circuit 110, however, threshold voltages of the DNMOS 111 and the ENMOS 112 may vary due to process fluctuations or other factors. The reference voltage circuit 110 in this case may fail to provide a reference voltage that is suited to a power supply voltage set in advance at the designing stage.

The output of a reference voltage that triggers reset cancellation at a power supply voltage higher than the given voltage set at the designing stage may delay the activation of the other circuit, even if the power supply voltage has reached a voltage beyond which there is no risk of the other circuit operating abnormally.

On the other hand, the output of a reference voltage that triggers reset cancellation at a power supply voltage lower than the given voltage set at the designing stage may cause the other circuit to operate abnormally because the power supply voltage has not reached the voltage beyond which there is no risk of the other circuit operating abnormally.

SUMMARY OF THE INVENTION

The present invention has been made in view of the above circumstance, and an object of the present invention is therefore to provide a reference voltage circuit and a power-on reset circuit which are capable of stably outputting a preset reference voltage in separate lots, in a transition state in which the power supply voltage VDD rises.

According to at least one embodiment of the present invention, there is provided a reference voltage circuit, including a first output terminal from which a first reference voltage is supplied; a first MOS transistor of a depletion type, the first MOS transistor containing a drain connected to a power supply terminal, a gate connected to a ground terminal, and a source; a first voltage drop circuit including a first end connected to the source of the first MOS transistor and a second end connected to the first output terminal; and a second MOS transistor of a depletion type, the second MOS transistor containing a drain connected to the first output terminal, a gate connected to the ground terminal, and a source connected to the ground terminal.

According to at least one embodiment of the present invention, there can be provided the reference voltage circuit and the power-on reset circuit which are capable of stably outputting the preset reference voltage in separate lots, in the transition state in which the power supply voltage VDD rises.

DETAILED DESCRIPTION OF THE PREFERRED EMBODIMENTS

First Embodiment

Figure 1:
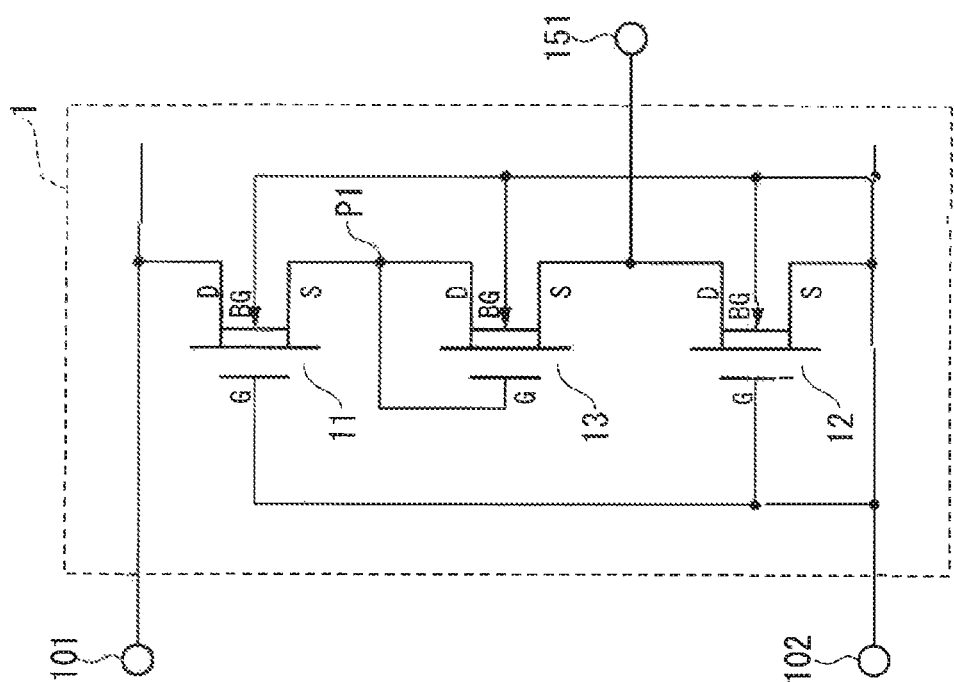
FIG. 1 is a circuit diagram for illustrating a configuration example of a reference voltage circuit according to a first embodiment of the present invention.

In the following, a description is given of a first embodiment of the present invention with reference to the drawings. FIG. 1 is a circuit diagram for illustrating a configuration of a reference voltage circuit 1 serving as a first reference voltage circuit which is an example of a reference voltage circuit according to the first embodiment of the present invention. The reference voltage circuit 1 includes a DNMOS 11 serving as a first MOS transistor, a DNMOS 12 serving as a second MOS transistor, and a DNMOS 13 serving as each of a first voltage drop circuit and a third MOS transistor. The DNMOSs 11, 12, and 13 are depletion N-channel MOS transistors.

The DNMOS 11 contains a drain D connected to a power supply terminal 101, a gate G connected to a ground terminal 102, and a source S.

The DNMOS 13 contains a drain D serving as one end of the first voltage drop circuit, a source S serving as the other end of the first voltage drop circuit, and a gate G connected to the drain D of the DNMOS 13 and the source S of the DNMOS 11. The source S of the DNMOS 13 is connected to an output terminal 151 as a first output terminal.

The DNMOS 12 contains a drain D connected to the output terminal 151 and the source S of the DNMOS 13, a gate G connected to the ground terminal 102, and a source S connected to the ground terminal 102 and the gate G of the DNMOS 12. The DNMOS 12 operates as a constant current source in which a drain current ID1 is a constant current.

Each of the DNMOS 11, the DNMOS 12, and the DNMOS 13 further includes a back gate BG connected to the ground terminal 102.

A threshold voltage Vth of each of the DNMOS 11, the DNMOS 12, and the DNMOS 13 depends on process fluctuations. The threshold voltage Vth of the DNMOS 11, the threshold voltage Vth of the DNMOS 12, and the threshold voltage Vth of the DNMOS 13 vary in conjunction with one another.

In the following description, the threshold voltage Vth that is higher than a threshold voltage Vth_typ is denoted as a threshold voltage Vth_H, and the threshold voltage Vth that is lower than the threshold voltage Vth_typ is denoted as a threshold voltage Vth_L. Incidentally, the threshold voltage Vth_typ is a design value of the threshold voltage Vth.

The drain current ID of the DNMOS 12 increases as the threshold voltage Vth rises, and decreases as the threshold voltage Vth drops.

A reference voltage Vref1 serving as a first reference voltage is provided from the output terminal 151. The reference voltage Vref1 is a voltage obtained by subtracting a voltage drop ID1·R1 from a voltage VT1 at a connection point P1. The voltage drop ID1·R1 is obtained by multiplying the drain current ID1 of the DNMOS 12 and a resistance value R1 of the DNMOS 13. The reference voltage Vref1 is accordingly expressed by Expression (1) as follows:

$$Vref1 = VT1 - ID1 \cdot R1 \qquad (1).$$

The voltage VT1 at the connection point P1 has a voltage level equal to the absolute value of the threshold voltage Vth of the DNMOS 11 if the power supply voltage VDD exceeds the absolute value of the threshold voltage Vth of the DNMOS 11.

In the case of the threshold voltage Vth that is the threshold voltage Vth_H, e.g., the voltage VT1 rises and the drain current ID1 increases as well in conjunction with the rise of the threshold voltage Vth.

As is understood from Expression (1), the rise of the threshold voltage Vth is accordingly canceled by an increase in voltage drop that is caused by the increase in drain current, with the result that the reference voltage Vref1 is kept from changing.

In the case of the threshold voltage Vth that is the threshold voltage Vth_L, on the other hand, the voltage VT1 drops and the drain current ID1 decreases as well in conjunction with the drop in threshold voltage Vth.

As is understood from Expression (1), the lowering of the threshold voltage Vth is accordingly canceled by a reduction in voltage drop that is caused by the decrease in drain current, with the result that the reference voltage Vref1 is kept from changing as in the case of an increase in threshold voltage Vth.

The resistance value R1 of the DNMOS 13 decreases as the threshold voltage Vth increases, and increases as the threshold voltage Vth drops. The DNMOS 13 accordingly reduces the effect of canceling the amount of variation in reference voltage Vref1 with variations in threshold voltage Vth.

However, a ratio $\alpha$ of a drain current ID1_H at the threshold voltage Vth_H and a drain current ID1_L at the threshold voltage Vth_L ($\alpha$=ID1_H/ID1_L) and a ratio $\beta$ of a resistance value R1_H and a resistance value R1_L ($\beta$=R1_H/R1_L) satisfy $\alpha \cdot \beta > 1$.

The reference voltage circuit 1 therefore suppresses a rise of the reference voltage Vref1 in response to an increase in threshold voltage Vth, and suppresses a drop in reference voltage Vref1 in response to the lowering of the threshold voltage Vth. The reference voltage circuit 1 is capable of outputting the same reference voltage Vref1 in accordance with the power supply voltage VDD despite variations in threshold voltage Vth.

In accordance with the first embodiment, the influence of variations in threshold voltage Vth from lot to lot (or wafer to wafer) that are caused by process fluctuations on the reference voltage Vref1 can be reduced (canceled) owing to the DNMOS 12, in which the drain current ID1 increases in conjunction with an increase in the threshold voltage Vth of the DNMOS 11 in the reference voltage circuit 1. The reference voltage Vref1 that is stable in voltage can accordingly be provided.

The drain current ID1 and the resistance value R1 also vary in conjunction with variations in threshold voltage Vth (i.e., the threshold voltages Vth_L, Vth_typ, and Vth_H) of each of the DNMOSs 11, 12, and 13 that are due to temperature, and the variations due to temperature have the same characteristics as those of the variations due to process fluctuation.

The reference voltage circuit 1 is therefore capable of outputting the reference voltage Vref1 that is stable in voltage level in the case of variations that are due to temperature as well, by canceling variations in drain current ID1 and in resistance value R1.

Although the reference voltage circuit 1 has a configuration in which the drain and gate of the DNMOS 13 are connected to one another, the reference voltage circuit 1 may have a configuration in which the gate is grounded or a given constant voltage is applied to the gate.

The description given above on the first embodiment takes as an example a case in which the DNMOS 13 is used as a voltage drop circuit. The reference voltage circuit and a power-on reset circuit, according to the first embodiment, however, are not limited to this example as far as $\alpha \cdot \beta > 1$ is satisfied. With $\alpha \cdot \beta > 1$ satisfied, the amount of variation in reference voltage Vref1 can be reduced compared to the amount of variation in threshold voltage Vth.

A voltage drop circuit having any configuration that satisfies $\alpha \cdot \beta > 1$ may therefore be used.

For instance, a pure resistor formed of polycrystalline silicon or amorphous silicon, or from a diffusion layer or the like, may be used as a voltage drop circuit instead of the DNMOS 13.

A configuration in which a gate of an enhancement N-channel MOS receives a given voltage to serve as an on-resistor may also be used as a voltage drop circuit.

Figure 3:
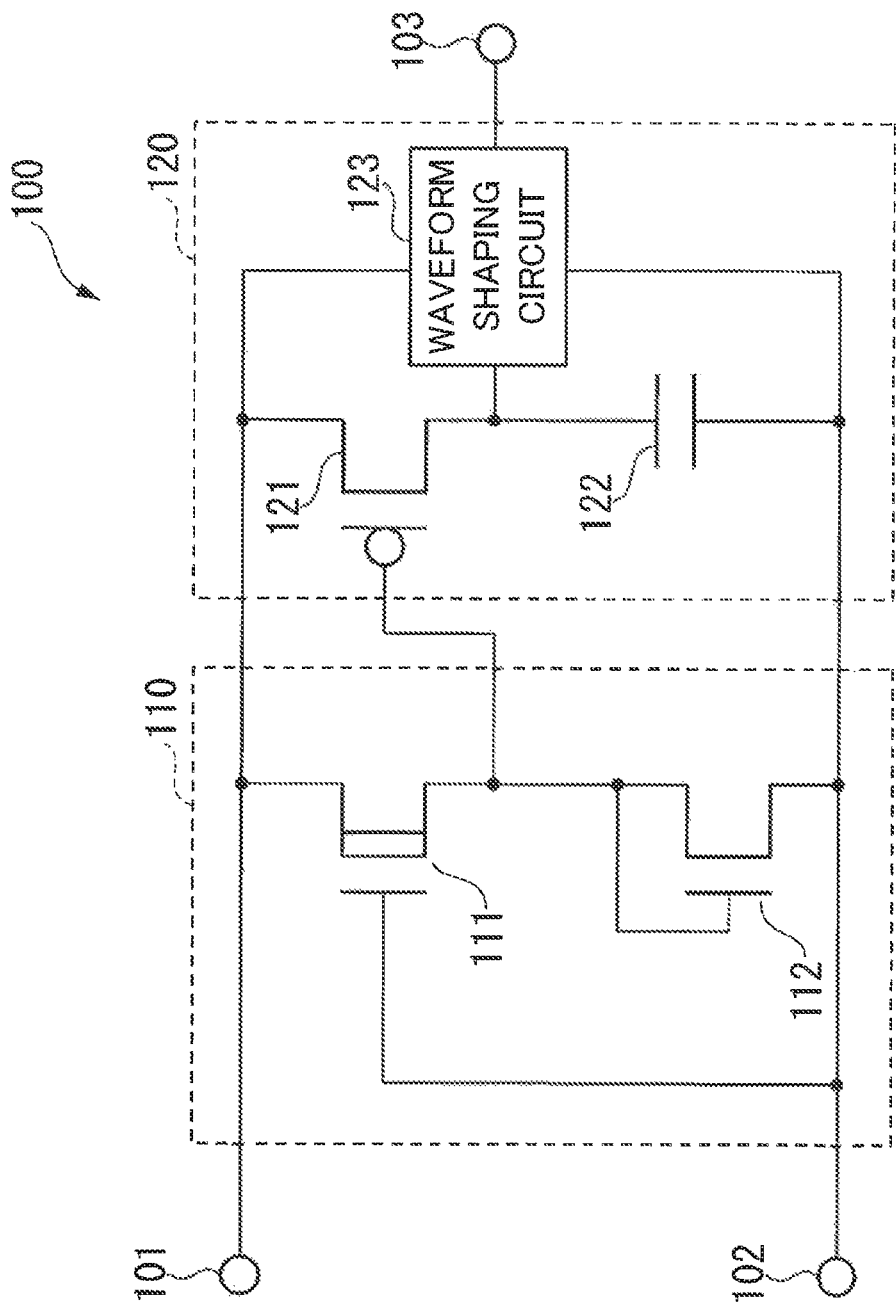
FIG. 3 is a circuit diagram for illustrating a configuration of a power-on reset circuit that uses a conventional reference voltage circuit.

The power-on reset circuit including the reference voltage circuit 1, serving as the power-on reset circuit according to the first embodiment, may be configured by connecting the output terminal 151 to an input terminal of the reset signal output circuit 120 (illustrated in FIG. 3) so that the reference voltage Vref1 from the output terminal 151 can be provided to the reset signal output circuit 120.

The reset signal output circuit 120 includes a PMOS 121, a capacitor 122, and a waveform shaping circuit 123. The PMOS 121 is an enhancement P-channel MOS transistor. The reference voltage Vref1 is applied to a gate of the PMOS 121. The reference voltage circuit 1 provides the reference voltage Vref1 described above to the reset signal output circuit 120 after the power supply voltage VDD exceeds the threshold voltage Vth of the DNMOS 11.

The power supply voltage VDD may rise to a given voltage at which a voltage difference between the power supply voltage VDD and the reference voltage Vref1 (VDD-Vref1) exceeds the absolute value of a threshold voltage of the PMOS 121. In this case, the PMOS 121 shifts from an off-state to an on-state, and provides a drain current to the capacitor 122.

The capacitor 122 is thus charged with the drain current flowing in the PMOS 121. A voltage provided to the waveform shaping circuit 123 may exceed a preset voltage at which reset cancellation is to be conducted. In this case, the voltage level of the reset signal is shifted from a level at which the reset state is set to a level at which the reset state is canceled.

The configuration described above allows the power-on reset circuit according to the first embodiment to receive, from the reference voltage circuit 1, the reference voltage Vref1 reduced in influence from variations in the threshold voltage Vth of each of the DNMOSs 11, 12, and 13 that are due to process fluctuations and variations in threshold voltage Vth that are due to temperature. As a result of receiving the reference voltage Vref1 provided by the reference voltage circuit 1, the power-on reset circuit according to the first embodiment is enabled to continue the reset state until the power supply voltage VDD reaches a given voltage that is a design value irrespective of process fluctuations from lot to lot (or wafer to wafer) and ambient temperature, and provide a reset signal for canceling the reset state from the output terminal 103 when the power supply voltage VDD reaches the given voltage.

Second Embodiment

Figure 2:
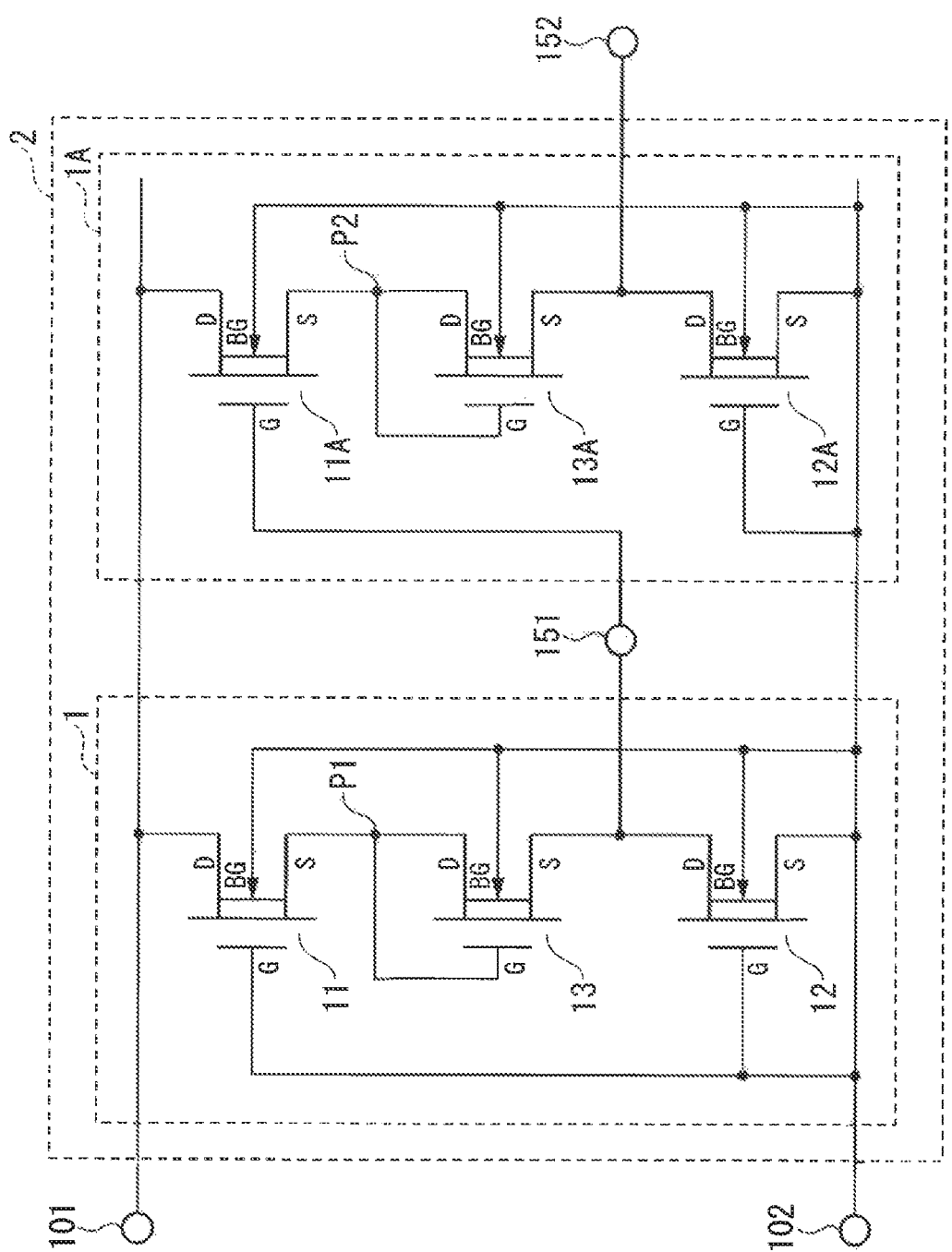
FIG. 2 is a circuit diagram for illustrating a configuration example of a reference voltage circuit according to a second embodiment of the present invention.

In the following, a description is given of a second embodiment of the present invention with reference to the drawings. FIG. 2 is a circuit diagram for illustrating a configuration of a reference voltage circuit 2 serving as an example of a reference voltage circuit according to the second embodiment of the present invention.

While the reference voltage circuit 2 differs from the reference voltage circuit 1 in that a reference voltage circuit 1A is further included, the rest of components of the reference voltage circuit 2 are substantially the same as those in the first embodiment. In the following description of the second embodiment, components that are the same as those of the reference voltage circuit 1 and the reset signal output circuit 120 are denoted by the same reference symbols in order to omit duplicate descriptions.

The reference voltage circuit 1A includes a DNMOS 11A serving as a fourth MOS transistor, a DNMOS 12A serving as a fifth MOS transistor, and a DNMOS 13A serving as a second voltage drop circuit and as a sixth MOS transistor. Similarly to the DNMOSs 11, 12, and 13 of the reference voltage circuit 1, the DNMOSs 11A, 12A, and 13A are depletion N-channel MOS transistors.

The DNMOS 11A contains a drain D connected to the power supply terminal 101, a gate G connected to the output terminal 151 of the reference voltage circuit 1, and a source S.

The DNMOS 13A contains a drain D serving as one end of the second voltage drop circuit, a source S serving as the other end of the second voltage drop circuit, and a gate G connected to the drain D of the DNMOS 13A and the source S of the DNMOS 11A. The source S of the DNMOS 13A is connected to an output terminal 152 as a second output terminal.

The DNMOS 12A contains a drain D connected to the output terminal 152 and the source S of the DNMOS 13A, a gate G connected to the ground terminal 102, and a source S connected to the ground terminal 102 and the gate G of the DNMOS 12A. The DNMOS 12A operates as a constant current source in which a drain current ID2 is a constant current.

Each of the DNMOS 11A, the DNMOS 12A, and the DNMOS 13A further includes a back gate BG connected to the ground terminal 102.

In the following description, as in the first embodiment, the threshold voltage Vth that is higher than the threshold voltage Vth_typ is denoted as the threshold voltage Vth_H, and the threshold voltage Vth that is lower than the threshold voltage Vth_typ is denoted as the threshold voltage Vth_L.

The drain current ID2 of the DNMOS 12A as well as the drain current ID1 of the DNMOS 12 increase as the threshold voltage Vth rises, and decrease as the threshold voltage Vth drops.

A reference voltage Vref2 serving as a second reference voltage is provided from the output terminal 152. The reference voltage Vref2 is a voltage obtained by subtracting a voltage drop ID2·R2 from a voltage VT2 at a connection point P2. The voltage drop ID2·R2 is obtained by multiplying the drain current ID2 of the DNMOS 12A and a resistance value R2 of the DNMOS 13A.

The reference voltage Vref2 is accordingly expressed by Expression (2) as follows:

$$Vref2 = VT2 - ID2 \cdot R2 \quad (2).$$

The voltage VT2 at the connection point P2 is a voltage that is obtained by adding the reference voltage Vref1 to the absolute value of the threshold voltage Vth of the DNMOS 11A (Vth+Vref1) because the reference voltage Vref1 is applied to the gate of the DNMOS 11A in the case of the power supply voltage VDD that exceeds the absolute value of the threshold voltage Vth of the DNMOS 11A.

In the reference voltage circuit 2, in the case of the threshold voltage Vth that is the threshold voltage Vth_H, the voltage VT2 rises as in the reference voltage circuit 1. The drain current ID2 increases as well in conjunction with the rise of the threshold voltage Vth.

As is understood from Expression (2), the rise of the threshold voltage Vth is accordingly canceled by an increase in voltage drop that is caused by the increase in drain current, with the result that the reference voltage Vref2 is kept from changing.

In the case of the threshold voltage Vth that is the threshold voltage Vth_L, on the other hand, the voltage VT2 drops and the drain current ID2 decreases as well in conjunction with the drop in threshold voltage Vth.

The lowering of the threshold voltage Vth is accordingly canceled by a reduction in voltage drop that is caused by the decrease in drain current, with the result that the reference voltage Vref2 is kept from changing as in the case of an increase in threshold voltage Vth.

As in the case of the DNMOS 13, the resistance value R2 of the DNMOS 13A decreases as the threshold voltage Vth increases, and increases as the threshold voltage Vth drops. The DNMOS 13A accordingly reduces the effect of canceling the amount of variation in reference voltage Vref2 with variations in threshold voltage Vth.

However, a ratio αA of a drain current ID2_H at the threshold voltage Vth_H and a drain current ID2_L at the threshold voltage Vth_L (αA=ID2_H/ID2_L) and a ratio BA of a resistance value R2_H and a resistance value R2_L (PA=R2_H/R2_L) satisfy αA·βA>1.

It is understood from this that the circuit configuration of the reference voltage circuit 1A functions to reduce the amount of variation in reference voltage Vref2 compared to the amount of variation in the threshold voltage Vth of each of the DNMOSs 11A, 12A, and 13A.

As in the first embodiment, the reference voltage circuit 1A therefore suppresses a rise of the reference voltage Vref2 in response to an increase in threshold voltage Vth, and suppresses a drop in reference voltage Vref2 in response to the lowering of the threshold voltage Vth. In such a manner, the reference voltage circuit 1A is capable of outputting the same reference voltage Vref2 in accordance with the power supply voltage VDD despite variations in threshold voltage Vth.

In other words, the reference voltage circuit 2 is capable of outputting the reference voltage Vref1 and the reference voltage Vref2 that are stable in voltage level because variations in threshold voltage Vth that are due to process fluctuations and variations in threshold voltage Vth that are due to temperature are canceled in each of the reference voltage circuits 1 and 1A.

With the configuration described above, the reference voltage Vref1 is applied to the gate of the DNMOS 11A, and the reference voltage circuit 1A is accordingly able to provide the reference voltage Vref2 higher than the reference voltage Vref1.

An advantage of the reference voltage circuit 2 having a two-stage configuration in which the reference voltage circuit 1 and the reference voltage circuit 1A are coupled to one another over the reference voltage circuit 1 having a single-stage configuration is that the reference voltage circuit 2 is applicable to uses in which the reference voltage Vref2 higher than the reference voltage Vref1 is used.

For instance, a reference voltage circuit having the single-stage configuration of the reference voltage circuit 1 may have difficulty in outputting a reference voltage Vref that is high enough to derive a satisfactory degree of effect of power-on reset in the case of a rise of the voltage at which the reset state is to be maintained. In this case, a reference voltage circuit capable of outputting the high reference voltage Vref can be obtained by using a two-stage configuration in which the reference voltage circuit 1 and the reference voltage circuit 1A are coupled to one another as in the reference voltage circuit 2 described above. Even if the reference voltage circuit has the two-stage configuration, the reference voltage Vref may be still low. In this case, a multi-stage reference voltage circuit having three or more stages may be configured by further coupling one or more reference voltage circuits 1A as one or more stages to the output terminal 152.

Although the reference voltage circuit 1A has a configuration in which the drain and gate of the DNMOS 13A as the second voltage drop circuit are connected to one another, the reference voltage circuit 1A may have a configuration in which the gate is grounded or a given constant voltage is applied to the gate.

The description given above on the second embodiment takes as an example a case in which the DNMOS 13A is used as a voltage drop circuit. The present invention, however, is not limited to this example as long as αA−βA>1 is satisfied. If αA·βA>1 is satisfied, the amount of variation in reference voltage Vref2 can be reduced compared to the amount of variation in threshold voltage Vth. Thus, a voltage drop circuit having any configuration that satisfies αA·βA>1 may therefore be used.

It is noted that the present invention is not limited to the above-described embodiments as they are and, in an implementation phase, can be embodied in various forms other than the specific embodiments described above. Various omissions, additions, substitutions, and changes may be made without departing from the spirit and scope of the invention. These embodiments and modifications thereof are included within the sprit and scope of the invention and are included within the scope of the invention as disclosed in the claims and equivalents thereof.

What is claimed is:

1. A reference voltage circuit, comprising:
    a first output terminal from which a first reference voltage is supplied;
    a first MOS transistor of a depletion type, the first MOS transistor containing a drain connected to a power supply terminal, a gate directly connected to a ground terminal, and a source;
    a first voltage drop circuit including a first end connected to the source of the first MOS transistor and a second end connected to the first output terminal; and
    a second MOS transistor of a depletion type, the second MOS transistor containing a drain connected to the first output terminal, a gate connected to the ground terminal, and a source connected to the ground terminal.

2. The reference voltage circuit according to claim 1, wherein the first voltage drop circuit is configured by a third MOS transistor of a depletion type, the third MOS transistor containing a gate connected only to the source of the first MOS transistor and a drain of the third MOS transistor, the drain of the third MOS transistor connected only to the source of the first MOS transistor and the gate of the third MOS transistor, and a source of the third MOS transistor connected to the first output terminal.

3. The reference voltage circuit according to claim 1, further comprising:
    a second output terminal from which a second reference voltage is supplied;
    a fourth MOS transistor of a depletion type, the fourth MOS transistor containing a drain connected to the power supply terminal, a gate connected to the first output terminal, and a source;
    a second voltage drop circuit including a first end connected to the source of the fourth MOS transistor and a second end connected to the second output terminal; and
    a fifth MOS transistor of a depletion type, the fifth MOS transistor containing a drain connected to the second output terminal, a gate connected to the ground terminal, and a source connected to the ground terminal.

4. The reference voltage circuit according to claim 3, wherein the second voltage drop circuit is configured by a sixth MOS transistor of a depletion type, the sixth MOS transistor containing a gate connected to the source of the fourth MOS transistor, a drain connected to the source of the fourth MOS transistor and the gate of the sixth MOS transistor, and a source connected to the second output terminal.

5. A power-on reset circuit, comprising:
   the reference voltage circuit of claim 1; and
   a reset signal output circuit configured to provide a reset signal based on a result of comparison between the first reference voltage supplied by the reference voltage circuit and a power supply voltage applied to the power supply terminal.

* * * * *